United States Patent
Beyer et al.

(10) Patent No.: US 9,548,312 B1
(45) Date of Patent: Jan. 17, 2017

(54) METHOD INCLUDING A FORMATION OF A CONTROL GATE OF A NONVOLATILE MEMORY CELL AND SEMICONDUCTOR STRUCTURE INCLUDING A NONVOLATILE MEMORY CELL

(71) Applicant: GLOBALFOUNDRIES Inc., Grand Cayman (KY)

(72) Inventors: Sven Beyer, Dresden (DE); Alexander Ebermann, Dresden (DE); Martin Schulze, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/937,041

(22) Filed: Nov. 10, 2015

(51) Int. Cl.
| H01L 21/4763 | (2006.01) |
| H01L 27/115 | (2006.01) |
| H01L 21/28 | (2006.01) |

(52) U.S. Cl.
CPC ... H01L 27/11524 (2013.01); H01L 21/28273 (2013.01)

(58) Field of Classification Search
USPC .......................................................... 438/618
See application file for complete search history.

(56) References Cited

U.S. PATENT DOCUMENTS

| 6,747,310 | B2 | 6/2004 | Fan et al. |
| 7,868,375 | B2 | 1/2011 | Liu et al. |
| 9,171,727 | B2* | 10/2015 | Nishikizawa ..... H01L 21/28008 |
| 9,196,748 | B2* | 11/2015 | Saito ..................... H01L 29/788 |
| 2014/0239367 | A1* | 8/2014 | Saito ..................... H01L 29/788 257/319 |
| 2014/0242767 | A1* | 8/2014 | Nishikizawa ..... H01L 21/28008 438/275 |

* cited by examiner

*Primary Examiner* — Telly Green
(74) *Attorney, Agent, or Firm* — Amerson Law Firm, PLLC

(57) ABSTRACT

A method includes providing a semiconductor structure including a nonvolatile memory cell element and one or more electrically insulating layers covering the nonvolatile memory cell element. The nonvolatile memory cell element includes a source region, a channel region, a drain region and a floating gate over at least a first portion of the channel region. A first opening is formed in the electrically insulating layers over the floating gate, a control gate insulation layer is deposited, and a second opening is formed in the electrically insulating layers over the drain region. The first opening and the second opening are filled with an electrically conductive material. The electrically conductive material in the first opening provides a control gate of the nonvolatile memory cell element and the electrically conductive material in the second opening provides an electrical contact to the drain region.

11 Claims, 11 Drawing Sheets

METHOD INCLUDING A FORMATION OF A CONTROL GATE OF A NONVOLATILE MEMORY CELL AND SEMICONDUCTOR STRUCTURE INCLUDING A NONVOLATILE MEMORY CELL

BACKGROUND

1. Field of the Invention

Generally, the present disclosure relates to the field of integrated circuits and, more particularly, to integrated circuits including nonvolatile memory devices.

2. Description of the Related Art

Nonvolatile memory, such as, for example, flash memory, may be used in various storage devices, such as, for example, secure digital memory cards (SD cards), USB sticks, solid state drives (SSDs), and internal memory of various electronic devices, such as, for example, mobile phones, tablet computers, media players, etc. Further applications of nonvolatile memory include embedded systems, wherein nonvolatile memory blocks including nonvolatile memory are provided in addition to host logic devices and wherein the nonvolatile memory devices and the logic devices are physically and electrically integrated on a single substrate, for example, a single monolithic silicon substrate. Embedded systems including nonvolatile memory find applications in various fields, such as, for example, in automotive, industry and communication market segments. Integrating nonvolatile memory and logic circuitry on a single substrate may help to improve performance and reduce costs compared to solutions wherein nonvolatile memory and logic circuitry are provided on separate substrates, for example, due to an elimination of input/output buffers, design flexibility, lower power consumption and/or system-on-a-chip capability.

Types of nonvolatile memory cell architectures include one transistor cells (1T-cells) including a single gate, as well as split gate solutions such as 1.5 transistor (1.5T) and 2 transistor (2T) cells.

Examples of known nonvolatile memory cells include those described in U.S. Pat. Nos. 6,747,310 and 7,868,375.

Nonvolatile memory cells as described in U.S. Pat. Nos. 6,747,310 and 7,868,375 include a source region and a drain region that are formed in a semiconductor substrate. Between the source region and the drain region, a channel region is provided that is doped differently than the source region and the drain region. Over the channel region, a floating gate and a select gate are provided. Over the floating gate, a control gate is provided, and an erase gate is provided over the source region. The select gate, the floating gate, the control gate and the erase gate are electrically insulated from each other and from the source, drain and channel regions by electrically insulating materials. The floating gate may be surrounded by electrically insulating material so that it is electrically floating. The source region, the drain region, the select gate, the control gate and the erase gate may have respective electrical contacts connected thereto so that voltages may be applied to the source region, the drain region and the select, control and erase gates for performing operations of programming, erasing and reading the nonvolatile memory cell.

For programming the nonvolatile memory cell, voltages adapted for creating a relatively strong, substantially vertically oriented electrical field in the channel region between the select gate and the floating gate may be applied to the select and control gates and the source and drain regions, which may cause a hot electron injection into the floating gate so that the floating gate is electrically charged. Since the floating gate is electrically floating, the charge injected into the floating gate can remain in the floating gate and can create an electric field that acts on a portion of the channel region below the floating gate.

For reading data from the nonvolatile memory cell, a voltage may be applied between the source region and the drain region, and a voltage adapted for creating an electrically conductive channel below the select gate may be applied to the select gate. Due to the influence of the electric charge in the floating gate on the portion of the channel region below the floating gate, a current flowing between the source region and the drain region can be influenced by the electric charge of the floating gate. Thus, it can be determined if an electric charge has been injected into the floating gate by means of a programming operation.

For erasing the nonvolatile memory cell, a relatively high positive voltage may be applied to the erase gate, and a Fowler-Nordheim tunneling of electrons from the floating gate to the erase gate may be obtained. Thus, an electric charge injected into the floating gate in the programming of the nonvolatile memory cell can be removed from the floating gate. The select gate can provide a separation of the floating gate from the drain which may help to substantially avoid or at least reduce an over-erase phenomenon.

In nonvolatile memory cells, each of the select gate, the control gate, the erase gate and the floating gate may be formed of polysilicon, and silicon dioxide, silicon nitride and/or silicon oxynitride may be used for providing an electrical insulation between the select gate, the control gate, the erase gate and the floating gate and for providing an electrical insulation between the gates and the source, drain and channel regions of the nonvolatile memory cell.

In techniques for the formation of nonvolatile memory cells, each of the select gate, the control gate, the erase gate and the floating gate may be formed in a front-end-of-line (FEOL) module of a semiconductor manufacturing process, wherein techniques of furnace polysilicon deposition and chemical mechanical polishing (CMP) of polysilicon may be employed. Moreover, known techniques may include the use of sacrificial spacers and self-aligned reactive ion etching (RIE) may be employed in the formation of nonvolatile memory cells.

Nonvolatile memory cells and techniques for the formation thereof as described above may have issues associated therewith. Chemical mechanical polishing of polysilicon may be relatively expensive and may cause a relatively high amount of defects that can reduce the yield of the manufacturing process. Additionally, applying techniques as described above for small technology nodes such as, for example, the 28 nm technology node and below may have issues associated therewith which may be related to a sensitivity of the manufacturing process with respect to a topography of the semiconductor structure. Moreover, in semiconductor structures manufactured in accordance with small technology nodes such as the 28 nm technology node and below, it may be of advantage to encapsulate gates of logic transistors including high-k materials formed in the same semiconductor structure in silicon nitride after patterning the gate electrodes of the logic transistor, and the encapsulation of gate electrodes of logic transistors may be adversely affected by manufacturing processes such as chemical mechanical polishing of polysilicon.

The present disclosure provides methods for the formation of nonvolatile memory cells and semiconductor structures including nonvolatile memory cells which may help to substantially overcome or at least reduce some or all of the above-mentioned issues.

SUMMARY OF THE INVENTION

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure. The semiconductor structure includes a nonvolatile memory cell element and one or more electrically insulating layers covering the nonvolatile memory cell element. The nonvolatile memory cell element includes a source region, a channel region, a drain region and a floating gate over at least a first portion of the channel region. A first opening is formed in the one or more electrically insulating layers over the floating gate. After the formation of the first opening, a control gate insulation layer is deposited. After the deposition of the control gate insulation layer, a second opening is formed in the one or more electrically insulating layers over the drain region. The first opening and the second opening are filled with an electrically conductive material. The electrically conductive material in the first opening provides a control gate of the nonvolatile memory cell element and the electrically conductive material in the second opening provides an electrical contact to the drain region.

An illustrative semiconductor structure disclosed herein includes a nonvolatile memory cell. The nonvolatile memory cell includes a source region, a channel region and a drain region that are provided in a semiconductor material, a floating gate over at least a first portion of the channel region, a control gate over the floating gate and a control gate insulation layer. The control gate insulation layer is arranged between the floating gate and the control gate. The semiconductor structure further includes one or more electrically insulating layers over the nonvolatile memory cell and a drain contact over the drain region. The one or more electrically insulating layers include a layer of an interlayer dielectric. The drain contact is electrically connected to the drain region. Each of the control gate and the drain contact extends through the one or more electrically insulating layers. The control gate and the drain contact are formed of a same electrically conductive material.

BRIEF DESCRIPTION OF THE DRAWINGS

The disclosure may be understood by reference to the following description taken in conjunction with the accompanying drawings, in which like reference numerals identify like elements, and in which.

Figure 1:
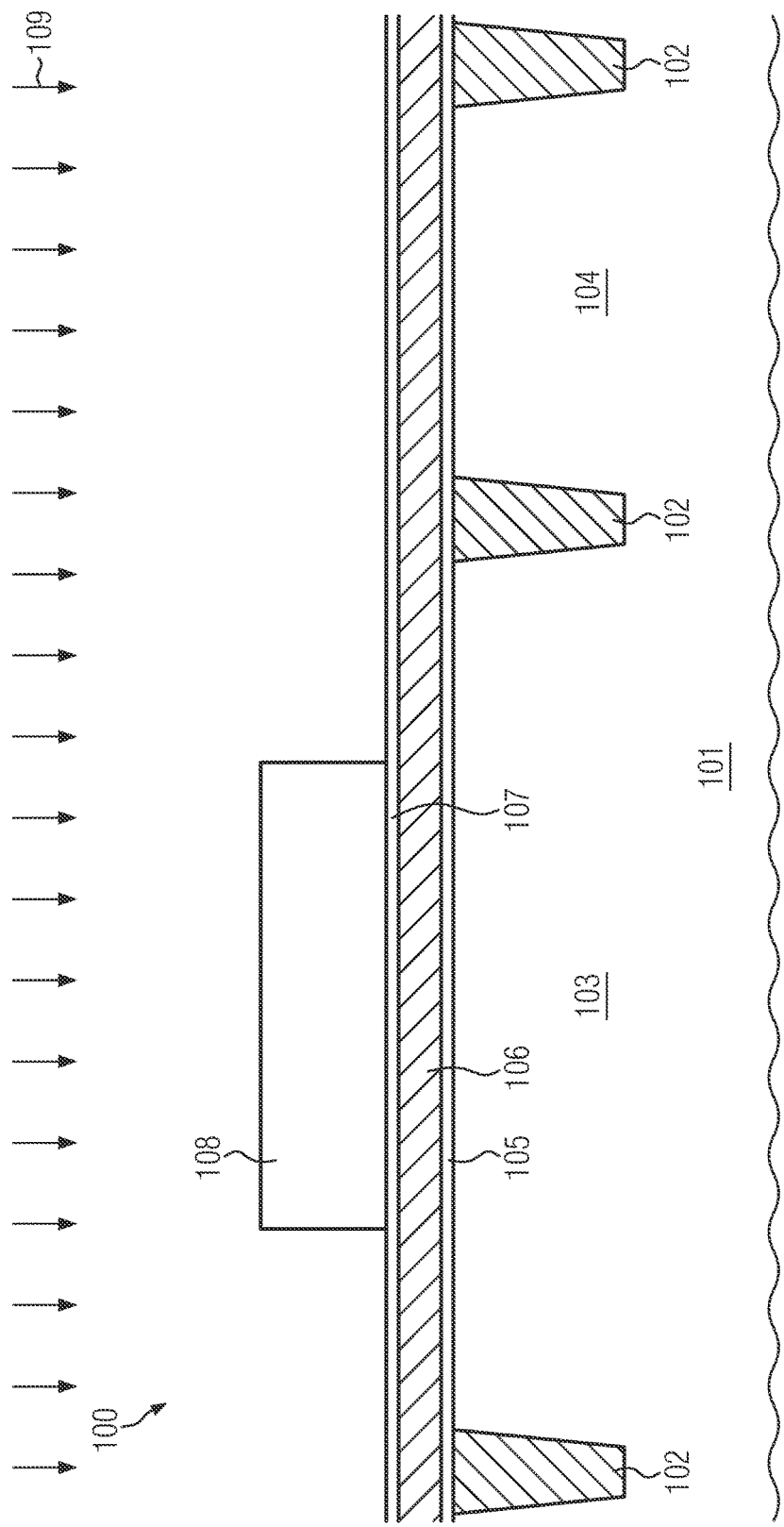
FIGS. 1-10 show schematic cross-sectional views of a semiconductor structure according to an embodiment in stages of a method of manufacturing a semiconductor structure according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Techniques as disclosed herein may allow avoiding a patterning of a control gate of a nonvolatile memory cell in the front-end-of-line module of a semiconductor manufacturing process. Thus, a polysilicon deposition process and a chemical mechanical polishing of polysilicon that are employed for the formation of the control gate, and, optionally, a formation of several sidewall spacers and material layers, which are performed in some techniques for the formation of control gates in the front-end-of-line module may be avoided. In embodiments disclosed herein, the formation of the control gate may be performed in a middle-of-line (MOL) part of the semiconductor manufacturing process wherein contacts to circuit elements on a semiconductor structure are formed. Thus, the topography of the semiconductor structure that is present during the front-end-of-line module of the semiconductor manufacturing process need not be affected by the formation of the control gate, and an adverse influence of the formation of the control gate on the encapsulation of gate electrodes on the semiconductor structure that are formed in accordance with the high-k metal gate (HKMG) technology may be substantially avoided.

In embodiments described herein, a control gate module may be created in the middle-of-line part of the semiconductor manufacturing process. After a chemical mechanical polishing of an interlayer dielectric that is formed over the semiconductor structure, and prior to the patterning of contacts that provide electrical connections to circuit elements formed in the semiconductor structure in the interlayer dielectric, a separate photolithography process and a self-aligned interlayer dielectric etch may be performed for forming openings in the interlayer dielectric at locations where control gates are to be formed. Thereafter, a dielectric liner that provides a control gate insulation layer may be deposited, and a further patterning process may be performed for forming contact holes in the interlayer dielectric. Then, the openings at the locations of control gates as well as the contact holes may be filled with a metal. In doing so, control gates of nonvolatile memory cells and contacts providing electrical connections to circuit elements may be formed. Some of the metal-filled contact holes may be used for providing electrical connections to elements of nonvolatile memory cells such as, for example, drain regions, select gates and/or erase gates thereof.

In some embodiments, techniques as described herein may be applied to nonvolatile memory cells, wherein a control gate that is separate from a select gate and electrically insulated therefrom, as well as erase gates, are provided, and wherein high-k metal gate (HKMG) integration techniques are applied, for example, for the formation of the select gates and/or gate electrodes of logic transistors that are formed on the same semiconductor substrate as the nonvolatile memory cells. Such embodiments will be described in detail below. However, the present disclosure is not limited to such embodiments. Generally, techniques as described herein may be applied to all flash memory technologies wherein a control gate is provided over a floating gate or a charge storage region of another type. In particular, techniques as described herein may also be applied to nonvolatile memory cells of a flash memory type wherein no erase gate and/or no select gate is provided.

FIG. 1 shows a schematic cross-sectional view of a semiconductor structure 100 according to an embodiment in a stage of a method of manufacturing a semiconductor structure according to an embodiment. The semiconductor structure 100 includes a substrate 101. The substrate 101 may be a bulk semiconductor substrate formed of a semiconductor material, for example, a wafer formed of a semiconductor material such as silicon. In other embodiments, the substrate 101 may be a semiconductor-on-insulator (SOI) substrate that includes a layer of a semiconductor material such as, for example, silicon that is provided above a support substrate, which may be a silicon wafer, and is separated from the support substrate by a layer of an electrically insulating material such as, for example, silicon dioxide.

The semiconductor structure 100 further includes a trench isolation structure 102. The trench isolation structure 102 may provide an electrical insulation between a nonvolatile memory region 103 and a logic transistor region 104. Additionally, the trench isolation structure 102 may electrically insulate the nonvolatile memory region 103 and the logic transistor region 104 from other regions (not shown) wherein circuit elements are to be formed in the semiconductor structure 100. The nonvolatile memory region 103 and the logic transistor region 104 may be provided in the semiconductor material of the substrate 101 and may be doped for providing a doping of active regions of nonvolatile memory cells and a logic transistor, respectively.

As will be detailed in the following, a pair of nonvolatile memory cells (denoted by reference numerals 1001 and 1002 in FIG. 10) may be formed at the nonvolatile memory region 103, and a logic transistor (denoted by reference numeral 626 in FIGS. 6-10) may be formed at the logic transistor region 104, wherein some method steps of the manufacturing process may be used both for forming features of the nonvolatile memory cells 1001, 1002 and for forming features of the logic transistor 626.

The present disclosure is not limited to embodiments wherein the nonvolatile memory region 103 and the logic transistor region 104 are provided directly adjacent to each other, as shown in FIGS. 1-10. In other embodiments, the nonvolatile memory region 103 and the logic transistor region 104 may be provided at a distance to each other, and regions wherein circuit elements other than the nonvolatile memory cells 1001, 1002 and the logic transistor 626 are formed may be arranged between the nonvolatile memory region 103 and the logic transistor region 104. In some embodiments, the nonvolatile memory region 103 may be provided in a portion of the semiconductor structure 100 wherein a dedicated nonvolatile memory block of an integrated circuit is formed, and the logic transistor region 104 may be provided in a portion of the semiconductor structure 100 wherein a dedicated logic circuit block of the integrated circuit is formed.

The present disclosure is not limited to embodiments wherein both nonvolatile memory cells and logic transistors are formed in the semiconductor structure 100. In other embodiments, the logic transistor region 104 may be omitted, and nonvolatile memory cells only may be formed in the semiconductor structure 100.

The trench isolation structure 102 may be formed by means of known techniques for forming shallow trench isolation structures, which may include processes of photolithography and etching for forming trenches in the substrate 101, processes of oxidation and/or deposition for filling the trenches with an electrically insulating material such as silicon dioxide, and processes of etching and/or chemical mechanical polishing for removing portions of the electrically insulating material outside the trenches. For providing a doping of the nonvolatile memory region 103 and the logic transistor region 104, techniques of ion implantation may be used.

An electrically insulating layer 105 may be formed over the semiconductor material of the substrate 101 in the nonvolatile memory region 103 and the logic transistor region 104. In some embodiments, the electrically insulating layer 105 may be a silicon dioxide layer, and it may be formed by means of a thermal oxidation process, wherein the semiconductor structure 100 is exposed to an oxidizing ambient including water vapor and/or oxygen at an elevated temperature to oxidize the semiconductor material of the substrate 101. In other embodiments, the electrically insulating layer 105 may be formed by means of a deposition process adapted for the deposition of silicon dioxide, for example, a chemical vapor deposition process and/or a plasma-enhanced chemical vapor deposition process.

A layer 106 of a floating gate material may be formed over the electrically insulating layer 105. In some embodiments, the layer 106 of floating gate material may include a semiconductor material, for example, polycrystalline silicon, nano-crystalline silicon and/or amorphous silicon. Techniques for the deposition of silicon such as chemical vapor deposition and/or plasma-enhanced chemical vapor deposition may be used for depositing the layer 106 of floating gate material, wherein parameters of the deposition process may be adapted such that the desired crystalline structure of the deposited floating gate material is obtained.

The present disclosure is not limited to embodiments wherein the layer 106 of floating gate material is formed of a semiconductor material. In other embodiments, the layer 106 of floating gate material may include silicon nitride, and it may be formed by means of a chemical vapor deposition process and/or a plasma-enhanced chemical vapor deposition process adapted for the deposition of silicon nitride.

An electrically insulating layer 107 may be formed over the layer 106 of floating gate material. Similar to the electrically insulating layer 105, the electrically insulating layer 107 may include silicon dioxide. For forming the electrically insulating layer 107, deposition processes for the deposition of silicon dioxide, such as chemical vapor deposition and/or plasma-enhanced chemical vapor deposition, may be used. Alternatively, a thermal oxidation process may be performed, wherein a portion of the layer 106 of floating gate material is oxidized to form the electrically insulating layer 107. In such embodiments, the layer 106 of floating gate material may initially be deposited with a slightly greater thickness to take the loss of material of the layer 106 of floating gate material that is caused by the oxidation into account.

After the formation of the electrically insulating layers 105, 107 and the layer 106 of floating gate material, the electrically insulating layers 105, 107 and the layer 106 of floating gate material may be patterned. The patterning may include a formation of a mask 108 over a portion of the nonvolatile memory region 103. The mask 108 may be a photoresist mask, and it may be formed by means of techniques of photolithography. Thereafter, one or more etch processes, which are illustrated by arrows 109 in FIG. 1, may be performed. The one or more etch processes 109 may include one or more dry etch processes, for example, reactive ion etch processes, that are adapted for removing the materials of the electrically insulating layers 105, 107 and the layer 106 of floating gate material.

Figure 2:
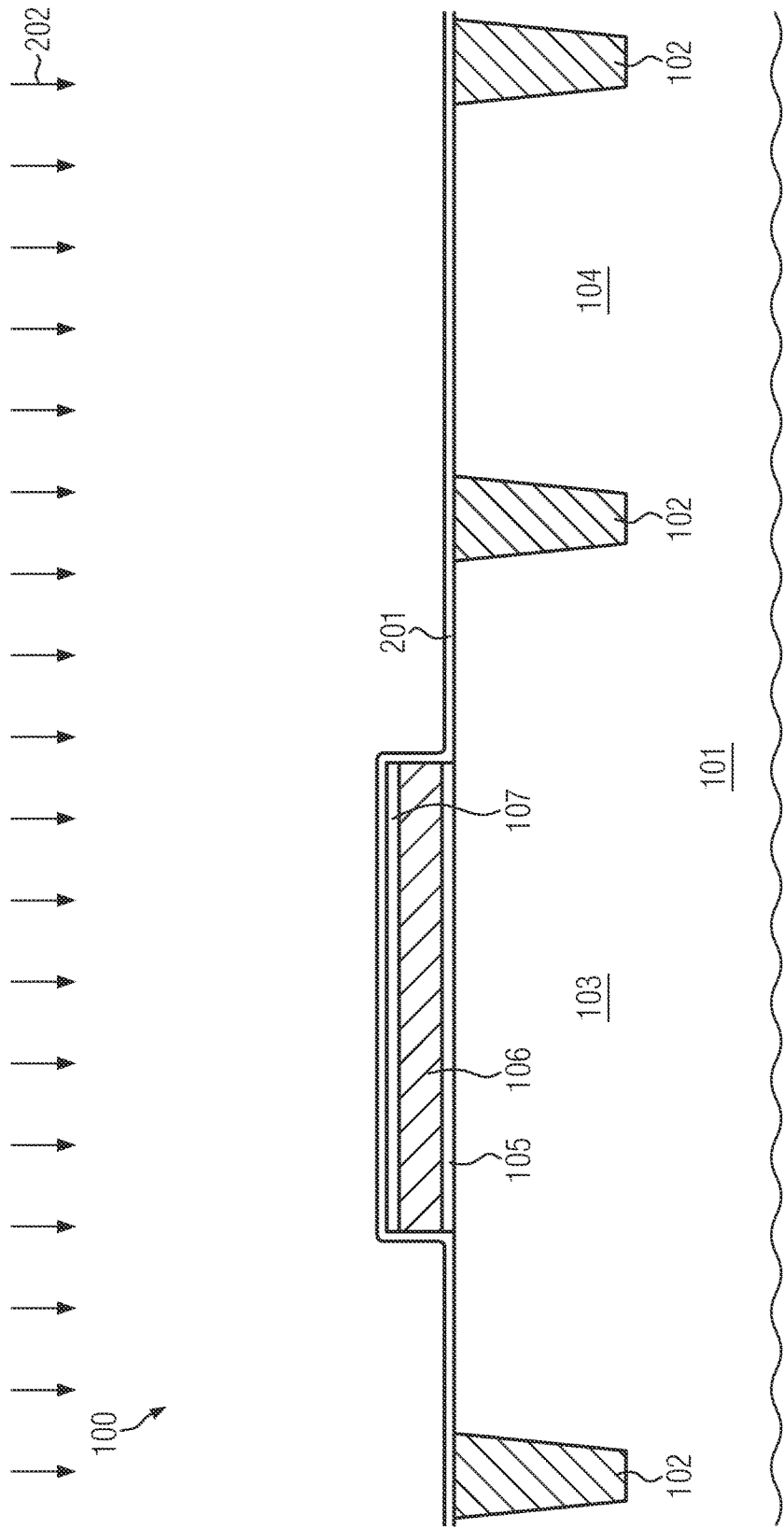

FIG. 2 shows a schematic cross-sectional view of the semiconductor structure 100 in a later stage of the manufacturing process. In the one or more etch processes 109, portions of the electrically insulating layers 105, 107 and the layer 106 of floating gate material which are not covered by the mask 108 may be removed from the semiconductor structure 100 so that the semiconductor material of the substrate 101 is exposed in the logic transistor region 104 and in portions of the nonvolatile memory region 103. Portions of the electrically insulating layers 105, 107 and the layer 106 of floating gate material that are covered by the mask 108 during the one or more etch processes 109 may remain in the semiconductor structure 100.

After the one or more etch processes, the mask 108 may be removed by means of a resist strip process, and an electrically insulating layer 201 may be deposited over the semiconductor structure 100. The electrically insulating layer 201 may include silicon dioxide. The electrically insulating layer 201 may be formed by means of a deposition process, such as a chemical vapor deposition process and/or a plasma-enhanced chemical vapor deposition process that is adapted for the deposition of silicon dioxide.

After the formation of the electrically insulating layer 201, an anisotropic etch process that is adapted for the removal of the material of the electrically insulating layer 201 may be performed. In FIG. 2, the anisotropic etch process is schematically illustrated by arrows 202. The anisotropic etch process 202 may be a dry etch process adapted for the removal of silicon dioxide, for example, a reactive ion etch process.

Figure 3:
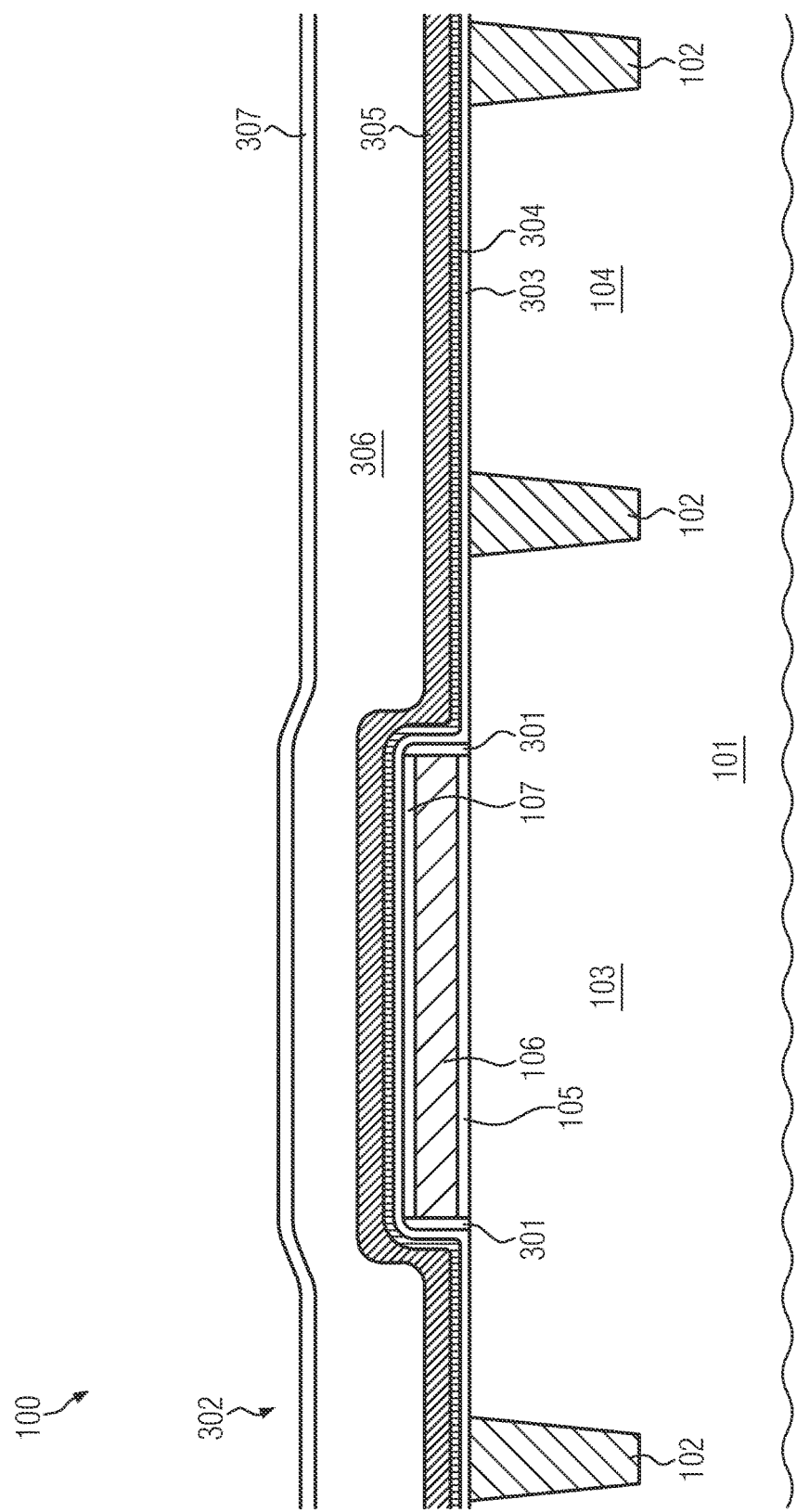

FIG. 3 shows a schematic cross-sectional view of the semiconductor structure 100 in a later stage of the manufacturing process. The anisotropic etch process 202 may remove portions of the electrically insulating layer 201 over substantially horizontal portions of the semiconductor structure 100, for example, portions of the electrically insulating layer 201 over a top surface of the layer stack formed by the electrically insulating layers 105, 107 and the layer 106 of floating gate material, and surfaces of the semiconductor material of the substrate 101 in the nonvolatile memory region 103 that are located at a distance to the layer stack. Moreover, the anisotropic etch process 202 may remove portions of the electrically insulating layer 201 over the logic transistor region 104 so that the semiconductor material of the substrate 101 is exposed in the logic transistor region 104. Due to the anisotropy of the anisotropic etch process 202, portions of the electrically insulating layer 201 at the sidewalls of the layer stack formed by the electrically insulating layers 105, 107 and the layer 106 of floating gate material may remain in the semiconductor structure and may form a sidewall spacer 301 at sidewalls of the layer stack. In particular, the sidewall spacer 301 may cover sidewalls of the layer 106 of floating gate material. Thus, the layer 106 of floating gate material is surrounded by the electrically insulating material of the electrically insulating layers 105, 107 and the sidewall spacer 301.

After the formation of the sidewall spacer 301, a gate stack 302 may be formed over the semiconductor structure 100. The gate stack 302 may include a base layer 303, a layer 304 of a high-k dielectric material, a metal layer 305, a layer 306 of a semiconductor material and a capping layer 307.

The base layer 303 may be a silicon dioxide layer, and it may have a thickness that is smaller than the thicknesses of the electrically insulating layers 105, 107 and 201. In particular, the thickness of the base layer 303 may be smaller than the thickness of the sidewall spacer 301, being an extension of the sidewall spacer 301 in a direction parallel to the surface of the substrate 101 (horizontal in the plane of drawing of FIG. 3). In some embodiments, a total thickness of the base layer 303 and the layer 304 of high-k dielectric material may also be smaller than the thickness of the sidewall spacer 301. The thickness of the sidewall spacer 301 may be approximately equal to or slightly smaller than the thickness of the electrically insulating layer 201. The base layer 303 may be formed by means of oxidation, chemical vapor deposition and/or plasma-enhanced chemical vapor deposition.

The layer 304 of high-k dielectric material may include a dielectric material having a greater dielectric constant than silicon dioxide. In some embodiments, the high-k dielectric material of the layer 304 may have a dielectric constant greater than about 4. In some embodiments, the layer 304 of high-k dielectric material may include one or more of hafnium dioxide, zirconium dioxide, hafnium silicon oxynitride, zirconium silicon oxynitride and/or hafnium zirconium oxide. The layer 304 of high-k dielectric material may be formed by means of techniques for the deposition of high-k dielectric materials which may include atomic layer deposition, chemical vapor deposition, plasma-enhanced chemical vapor deposition and/or physical vapor deposition.

The metal layer 305 may include a metal having a work function that is suitable for work function engineering in N-channel field effect transistors such as, for example, lanthanum, lanthanum nitride and/or titanium nitride. The metal layer 305 need not be a substantially homogeneous layer. In some embodiments, the metal layer 305 may include sublayers that are formed of different metals.

The layer 306 of semiconductor material may include polysilicon, and it may be formed by means of chemical vapor deposition and/or plasma-enhanced chemical vapor deposition. The capping layer 307 may include one or more dielectric materials such as, for example, silicon dioxide, silicon nitride and/or silicon oxynitride, and it may be formed by means of chemical vapor deposition and/or plasma-enhanced chemical vapor deposition.

Further features of the gate stack 302 may correspond to those of gate stacks that are conventionally employed in the formation of gates of field effect transistors in accordance with high-k metal gate techniques wherein a gate-first manufacturing technique is employed. In particular, features of the gate stack 302 may correspond to features of gate stacks that are formed over portions of a semiconductor structure wherein N-channel field effect transistors are to be formed.

The present disclosure is not limited to embodiments wherein the sidewall spacer 301 is formed. In other embodiments, the formation of the electrically insulating layer 201 and the anisotropic etch process 202 may be omitted so that the sidewall spacer 301 is not formed. In such embodiments, the layer 106 of floating gate material is surrounded by the electrically insulating materials of the electrically insulating layers 105, 107, the base layer 303 and the layer 304 of high-k dielectric material. However, providing the sidewall spacer 301 may help to reduce a coupling between floating gates and select gates of nonvolatile memory cells, which may help to substantially prevent read disturbs in the reading of data from the nonvolatile memory cells. Furthermore, the sidewall spacer 301 may help to substantially prevent an electrical breakdown between the floating gate and the select gate or at least reduce the likelihood of an electrical breakdown occurring. Moreover, the sidewall spacer 301 may substantially prevent or at least reduce a tunneling current between the floating gate and the select gate. The base layer 303 may be provided with a relatively small thickness which may help to improve the controllability of a channel region of the nonvolatile memory cell. The formation of the floating gates, select gates and channel regions of the nonvolatile memory cells will be described below.

Figure 4:
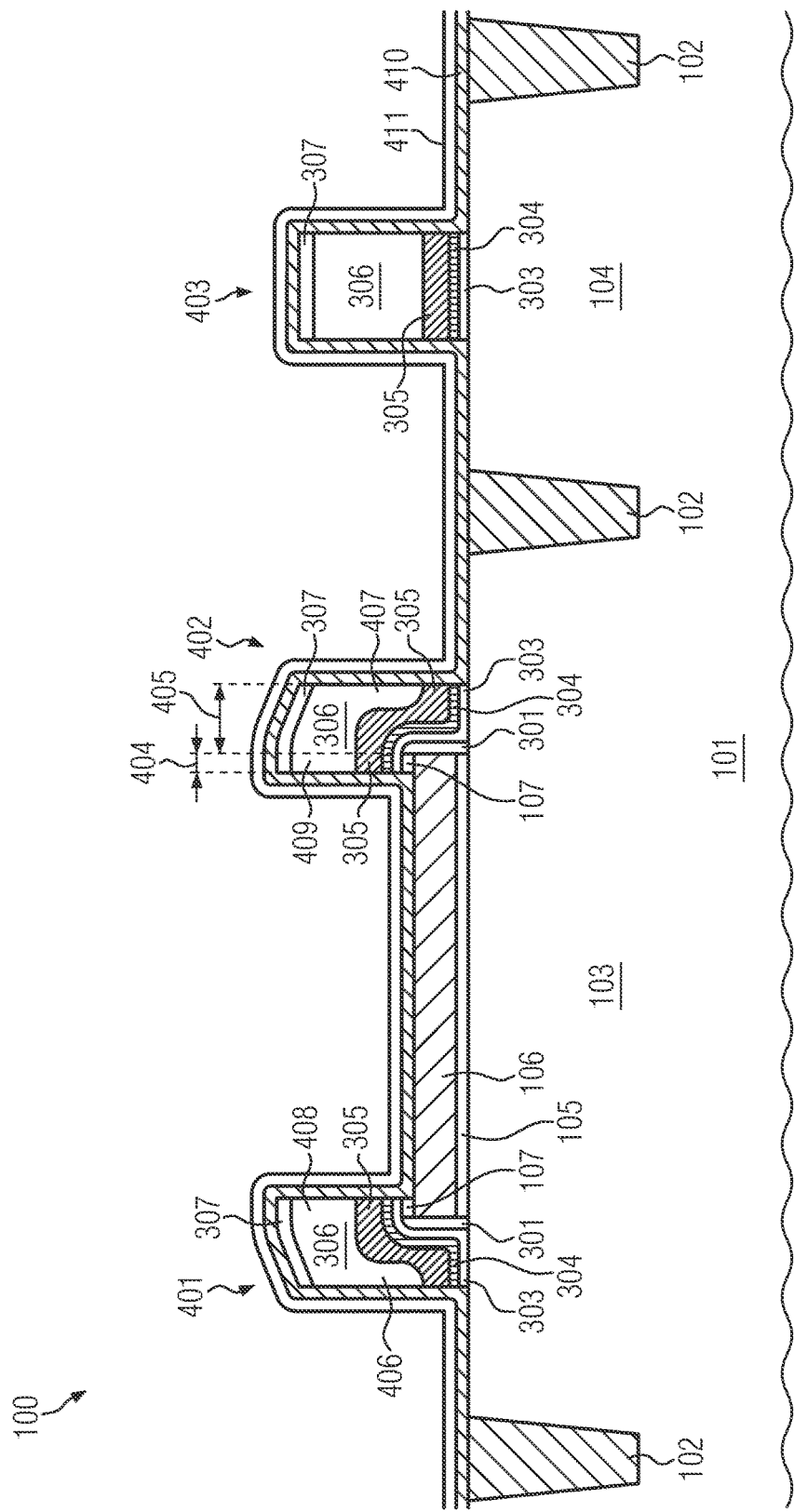

FIG. 4 shows a schematic cross-sectional view of the semiconductor structure 100 in a later stage of the manufacturing process. After the formation of the gate stack 302, the gate stack 302 may be patterned. This may be done by means of techniques of photolithography and etching that are conventionally employed in the formation of gate electrodes of field effect transistors in accordance with gate-first high-k metal gate techniques. In some embodiments, in the patterning of the gate stack 302, the capping layer 307 may be patterned by means of techniques of photolithography and etching to form a hardmask from the capping layer 307. Thereafter, a photoresist mask used in the patterning of the capping layer 307 may be removed by means of a resist strip process, and one or more etch processes adapted for removing materials of the layer 306 of semiconductor material, the metal layer 305, the layer 304 of high-k dielectric material and the base layer 303 may be performed. Portions of the layers 306, 305, 304, 303 below the hardmask formed by the patterning of the capping layer 307 may remain in the semiconductor structure 100. In the patterning of the gate stack 302, select gates 401, 402 may be formed over the nonvolatile memory region 103, and a gate 403 of a logic transistor may be formed over the logic transistor region 104. Since the select gates 401, 402 and the gate 403 of the logic transistor have each been formed from the gate stack 302, each of the select gates 401, 402 and the gate 403 of the logic transistor may include corresponding materials. In particular, each of the select gates 401, 402 and the gate 403 of the logic transistor may include a gate insulation layer including a respective portion of the layer 304 of high-k dielectric material, each of the gate insulation layers including substantially the same high-k dielectric material and a gate electrode including a respective portion of the metal layer 305, each of the gate electrodes including substantially the same metal.

In addition to the portions of the layers of the gate stack 302, in the patterning of the gate stack 302, portions of the electrically insulating layer 107 that are not arranged below the select gates 401, 402 may be removed. In particular, in embodiments wherein the electrically insulating layer 107 and the base layer 303 are both formed of silicon dioxide, portions of the base layer 303 and the electrically insulating layer 107 may be removed in a common etch process. Thus, after the patterning of the gate stack 302, the floating gate material of the layer 106 of floating gate material and the semiconductor material of the substrate 101 in the nonvolatile memory region 103 and the logic transistor region 104 may be exposed at the surface of the semiconductor structure 100.

Each of the select gates 401, 402 may include a first portion that is located adjacent the layer 106 of floating gate material and the electrically insulating layers 105, 107. In FIG. 4, the first portion of the select gate 401 is denoted by reference numeral 406, and the first portion of the select gate 402 is denoted by reference numeral 407. Additionally, each of the select gates 401, 402 may include a second portion that is located over the electrically insulating layers 105, 107 and the layer 106 of floating gate material. In FIG. 4, reference numeral 408 denotes the second portion of the select gate 401, and reference numeral 409 denotes the second portion of the select gate 402. Each of the second portions 408, 409 of the select gates 401, 402 is separated from the layer 106 of floating gate material by a portion of the electrically insulating layer 107. Furthermore, each of the first portions 406, 407 of the select gates 401, 402 may be separated from the layer 106 of floating gate material by the sidewall spacer 301. A part of the first portions 406, 407 of the select gates adjacent the respective second portion 408, 409 may be arranged over the sidewall spacer 301.

An extension of the first portions 406, 407 of the select gates 401, 402 in a direction from the select gate 401 to the select gate 402, corresponding to a channel length direction of the nonvolatile memory cells to be formed in the nonvolatile memory region 103, may be greater than an extension of the second portions 408, 409 in the channel length direction. In FIG. 4, reference numeral 404 exemplarily denotes the extension of the second portion 409 of the select gate 402 in the channel length direction, and reference numeral 405 denotes the extension of the first portion 407 of the select gate 402 in the channel length direction. In some embodiments, the extension 405 of the first portion 407 of the select gate 402 in the channel length direction may be in a range from about 52-88 nm, for example, about 70 nm. The extension 404 of the second portion 409 of the select gate 402 in the channel length direction may be in a range from about 10-40 nm, for example, about 21 nm. The select gate 401 may have dimensions corresponding to those of the select gate 402.

The second portions 408, 409 of the select gates 401, 402 provide an overhang of the select gates 401, 402 over floating gate electrodes that are formed from the layer 106 of floating gate material, as described below.

The present disclosure is not limited to embodiments wherein there is an overhang of the select gates 401, 402 over the layer 106 of floating gate material. In other embodiments, the entire select gates 401, 402 may be formed adjacent the layer 106 of floating gate material and the electrically insulating layers 103, 106.

Dimensions of the gate 403 of the logic transistor may correspond to dimensions of logic transistor gates that are provided in accordance with the 28-nm technology node.

After the formation of the select gates 401, 402 and the gate 403 of the logic transistor, an encapsulation layer 410 may be deposited over the semiconductor structure 100. The encapsulation layer 410 may include silicon nitride, and it may be formed by means of molecular layer deposition. The encapsulation layer 410 may cover sidewalls of each of the select gates 401, 402 and the gate 403 of the logic transistor. The encapsulation layer 410 may be provided both at sidewalls of the first portions 406, 407 of the select gates 401, 402 which are located lateral to the layer 106 of floating gate material and at sidewalls of the second portions 408, 409 of the select gates 401, 402 which are located over the layer 106 of floating gate material. The encapsulation layer 410 may provide an encapsulation of the high-k dielectric material of the layer 304 of high-k dielectric material on both sides of the select gates 401, 402. In embodiments wherein there is an overhang of the select gates 401, 402 over the layer 106 of floating gate material, the encapsulation layer 410 need not be arranged between the first portions of the select gates 401, 402 and the layer 106 of floating gate material, which may help to avoid topography issues that can occur in nonvolatile memory cells wherein the entire select gate is arranged adjacent the floating gate.

After the formation of the encapsulation layer 410, a layer 411 of sidewall spacer material may be deposited over the semiconductor structure 100. The layer 411 of sidewall spacer material may be formed of a material that can be etched selectively relative to the material of the encapsulation layer 410. In embodiments wherein the encapsulation layer 410 includes silicon nitride, the layer 411 of sidewall spacer material may include silicon dioxide.

Figure 5:
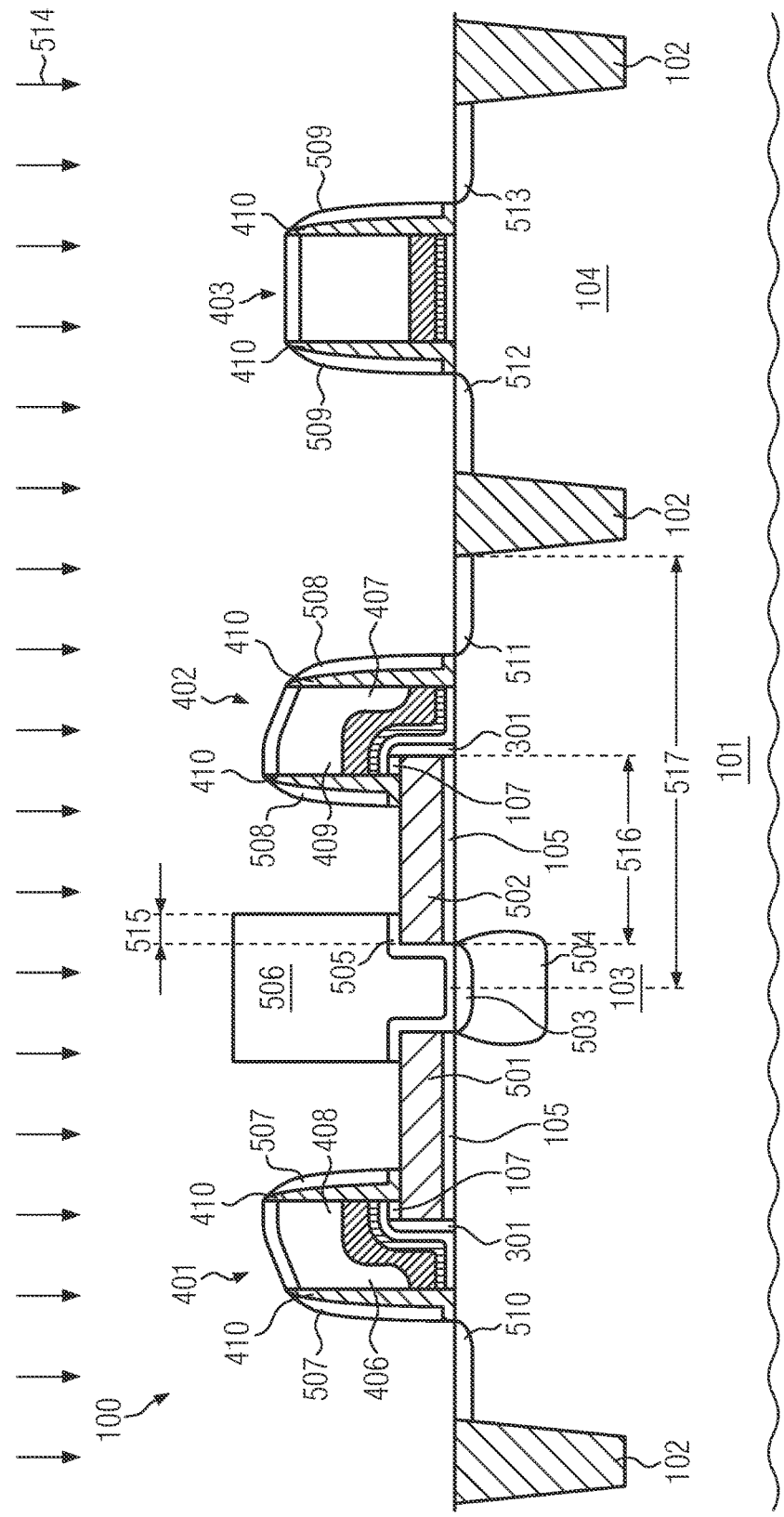

FIG. 5 shows a schematic cross-sectional view of the semiconductor structure 100 in a later stage of the manufacturing process. For clarity of illustration, in FIG. 5, some of the reference numerals of features of the semiconductor structure 100 shown in FIG. 4 have been omitted. Unless explicitly indicated otherwise, features shown in FIG. 4 whose reference numerals have been omitted in FIG. 5, and which are shown in FIG. 5, may still be present in the semiconductor structure 100 at the stage of the manufacturing process illustrated in FIG. 5.

After the deposition of the encapsulation layer 410 and the layer 411 of sidewall spacer material, a floating gate 501 and a floating gate 502 may be formed on the basis of the layer 106 of floating gate material. Each of the floating gates 501, 502 will be provided in one of the pair of nonvolatile memory cells 1001, 1002 (see FIG. 10) that is formed in the nonvolatile memory region 103. Adjacent the floating gates 501, 502, a source region 504 that is doped differently (opposite) than portions of the semiconductor material of the nonvolatile memory region 103 below the floating gates 501, 502 and the select gates 401, 402 may be formed. Over the source region 504, an erase gate 506 may be formed. The erase gate 506 may include a semiconductor material, for example polysilicon. The erase gate 506 may be separated from the floating gates 501, 502 by a tunneling layer 505. A portion of the tunneling layer 505 may also be provided between the erase gate 506 and the source region 504. The tunneling layer 505 may be formed of an electrically insulating material such as silicon dioxide. In some embodiments, in addition to the portion of the tunneling layer 505, an insulation region 503 may be provided between the erase gate 506 and the source region 504. The insulation region 503 may include an oxide of the semiconductor material of the substrate 101, for example silicon dioxide.

The source region 504 provides a common source region of the nonvolatile memory cells 1001, 1002 that are formed in the nonvolatile memory region 103, and the erase gate 506 provides a common erase gate of the nonvolatile memory cells 1001, 1002.

The source region 504 and the erase gate 506 are arranged on a side of the floating gate 501 opposite to the select gate 401 and on a side of the floating gate 502 opposite to the select gate 402. As shown in FIG. 5, the erase gate 506 and the tunneling layer 505 may include portions that are arranged over the floating gates 501, 502 so that there is an overhang of the erase gate 506 and the tunneling layer 505 over the floating gates 501, 502.

In FIG. 5, a size of the overhang of the erase gate 506 over the floating gate 502 is denoted by reference numeral 515. In some embodiments, the size of the overhang 515 may have a value in a range from about 15-21 nm, for example, a value of about 18 nm. The overhang of the erase gate 506 over the floating gate 501 may have corresponding values.

An extension of each of the floating gates 501, 502 in the channel length direction of the nonvolatile memory cells to be formed in the nonvolatile memory region 103, as exemplarily denoted by reference numeral 516 for the floating gate 502 in FIG. 5, may have a value in a range from about 80-220 nm, for example, a value of about 200 nm.

An extension of the nonvolatile memory cells 1001, 1002 to be formed in the nonvolatile memory region 103 in the channel length direction, as exemplarily denoted by reference numeral 517 for one of the nonvolatile memory cells in FIG. 5 extending from the center of the source region 504 to the trench isolation structure 102, may have a value in a range from about 300-500 nm, for example, a value of about 400 nm, so that the nonvolatile memory cells can fit into a 0.047 $\mu m^2$ cell having a minimum RX pitch.

In some embodiments, techniques for obtaining a self-alignment between the source region 504 and the erase gate 506 may be used in the formation of the source region 504, the insulation region 503, the tunneling layer 505 and the erase gate 506. For this purpose, a layer of a hardmask material (not shown) may be formed over the semiconductor structure 100. The layer of hardmask material may be formed of a material that can be etched selectively relative to the material of the layer 411 of sidewall spacer material. In embodiments wherein the layer 411 of sidewall spacer material includes silicon dioxide, the hardmask material may include silicon nitride. A thickness of the layer of hardmask material may be greater than the height of the erase gate 506. In some embodiments, the layer of hardmask material may be polished, for example by means of chemical mechanical polishing, to obtain a substantially planar surface of the layer of hardmask material without bumps over the select gates 401, 402 and the gate 403 of the logic transistor, which might be caused by the topology of the select gates 401, 402 and the gate 403 of the logic transistor. The layer of hardmask material may cover the select gates 401, 402 and the gate 403 of the logic transistor so that the select gates 401, 402 and the gate 403 of the logic transistor are not exposed at the surface of the semiconductor structure 100.

The layer of hardmask material may be patterned to form a hardmask having an opening at the location where the erase gate 506 is to be formed. For obtaining the overhang of the erase gate 506 and the tunneling layer 505 over the floating gates 501, 502, a sacrificial sidewall spacer may be formed at the sidewalls of the opening of the hardmask using techniques of isotropic deposition and anisotropic etching. Then, one or more etch processes adapted for removing the materials of the layer 106 of floating gate material and the electrically insulating layer 105 may be performed. Then, the insulation region 503 may be formed using known techniques for the local oxidation of silicon (LOCOS), and an ion implantation process may be performed for forming the source region 504 by implantation of ions of a dopant into the semiconductor material of the substrate 101 in the nonvolatile memory region 103. Thereafter, the sacrificial sidewall spacer formed at the sidewalls at the opening of the hardmask may be removed, and the tunneling layer 505 may be formed using techniques of deposition and/or oxidation. Thereafter, a layer of the material of the erase gate 506, for example a polysilicon layer, may be deposited over the semiconductor structure 100, for example by means of chemical vapor deposition or plasma-enhanced chemical vapor deposition. Thereafter, a chemical mechanical polishing process may be performed for removing portions of the layer of the material of the erase gate 506 and/or the material of the tunneling layer 505 outside the opening of the hardmask. Then, the hardmask may be removed by means of an etch process that is adapted to selectively remove the material of the hardmask relative to the materials of the erase gate 506 and the layer 411 of sidewall spacer material.

Thereafter, an anisotropic etch process that is adapted to selectively remove the sidewall spacer material of the layer 411 of sidewall spacer material relative to the material of the encapsulation layer 410 may be performed. Portions of the layer 411 of sidewall spacer material at sidewalls of the select gates 401, 402 and the gate 403 of the logic transistor may remain in the semiconductor structure 100 due to the anisotropy of the etch process so that sidewall spacers 507, 508, 509 are formed at sidewalls of the select gates 401, 402 and the gate 403 of the logic transistor. Then, an etch process adapted to remove the material of the encapsulation layer 410 may be performed. Portions of the encapsulation layer 410 that are covered by the sidewall spacers 507, 508, 509 may remain in the semiconductor structure 100 so that the high-k dielectric materials of the select gates 401, 402 and the gate 403 of the logic transistor remain encapsulated by the encapsulation layer 410. In some embodiments, portions of the encapsulation layer 410 between the erase gate 506 and the floating gates 501, 502 (not shown) may also remain in the semiconductor structure 100.

After the formation of the sidewall spacers 507, 508, 509, an ion implantation process, that is schematically illustrated by arrows 514 in FIG. 5, may be performed. In the ion implantation process 514, the semiconductor structure 100 may be irradiated with ions of a dopant so that drain extensions 510, 511 are formed adjacent the select gates 401, 402, and a source extension 512 and a drain extension 513 are formed adjacent the gate 403 of the logic transistor. In some embodiments, a halo implantation for forming halo regions (not shown) may also be performed.

Figure 6:
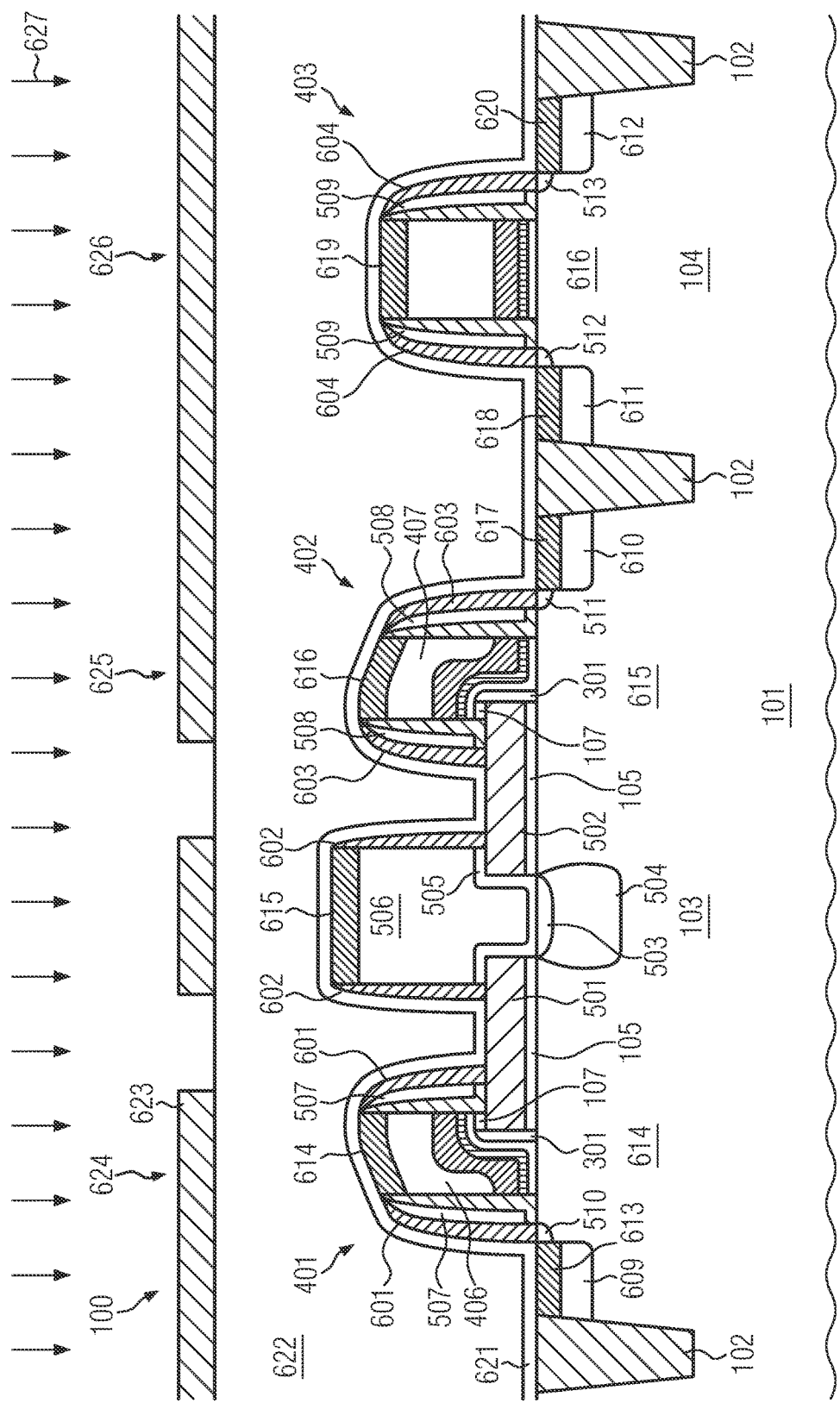

FIG. 6 shows a schematic cross-sectional view of the semiconductor structure 100 in a later stage of the manufacturing process. For clarity of illustration, in FIG. 6, some reference numerals of elements of the semiconductor structure 100 have been omitted. Unless explicitly indicated otherwise, features shown in FIG. 5 whose reference numerals have been omitted in FIG. 6, and which are shown in FIG. 6, may still be present in the semiconductor structure 100 at the stage of the manufacturing process illustrated in FIG. 6.

After the formation of the drain extensions 510, 511, the source extension 512 and the drain extension 513, a sidewall spacer 601 may be formed adjacent the select gate 401, a sidewall spacer 602 may be formed adjacent the erase gate 506, a sidewall spacer 603 may be formed adjacent the select gate 402, and a sidewall spacer 604 may be formed adjacent the gate 403 of the logic transistor. For forming the sidewall spacers 601, 602, 603, 604, a layer of a material of the sidewall spacers 601, 602, 603, 604, for example, a silicon dioxide layer, may be deposited over the semiconductor structure 100, and an anisotropic etch process may be performed for removing portions of the layer of the material of the sidewall spacers 601, 602, 603, 604 over substantially horizontal portions of the semiconductor structure 100. In some embodiments, a liner layer, for example a silicon nitride layer (not shown), may be provided below the layer of the material of the sidewall spacers 601, 602, 603, 604, which may be used as an etch stop layer.

Thereafter, an ion implantation process may be performed, wherein the semiconductor structure 100 is irradiated with ions of a dopant. Thus, drain regions 609, 610 may be formed adjacent the select gates 401, 402, and a source region 611 and a drain region 612 may be formed adjacent the gate 403 of the logic transistor. The drain regions 609, 610 and the drain extensions 510, 511 are arranged at sides of the first portions 406, 407 of the select gates 401 and 402 that are opposite to the floating gates 501 and 502, respectively.

Portions of the nonvolatile memory region 103 between the source region 504 and the drain region 609 may have a doping that corresponds to the initial doping of the nonvolatile memory region 103 and form a channel region 614 having a portion below the first portion 406 of the select gate 401 and a portion below the floating gate 501. Portions of the nonvolatile memory region 103 between the source region 504 and the drain region 610 may have a doping that substantially corresponds to the initial doping of the nonvolatile memory region 103 and form a channel region 615 having a portion below the first portion 407 of the select gate 402 and a portion below the floating gate 502.

In some embodiments, the source region 504, the drain regions 609, 610 and the drain extensions 510, 511 may be N-doped, and the channel regions 614, 615 may be substantially undoped or P-doped.

A portion of the semiconductor material of the logic transistor region 104 between the source region 611 and the drain region 612 may have a doping that is different from the doping of the source region 611, the source extension 512, the drain region 612 and the drain extension 513 and may form a channel region 616 below the gate 403 of the logic transistor. In some embodiments, the source region 611, the source extension 512, the drain region 612 and the drain extension 513 may be N-doped, and the channel region 616 may be P-doped or substantially undoped. Thus, an N-channel logic transistor 626, being representative of an N-channel logic transistor in a logic circuit in the semiconductor structure 100, may be provided at the logic transistor region 104.

In some embodiments, silicide regions 613, 617, 618 and 620, respectively, may be formed in the drain regions 609, 610, the source region 611 and the drain region 612. Additionally, silicide regions 614, 615, 616 and 619, respectively, may be formed in the select gates 401, 402, the erase gate 506, and the gate 403 of the logic transistor. This may be done in accordance with known techniques for the formation of silicide, which may include a deposition of a layer of a metal over the semiconductor structure 100 and one or more annealing processes for initiating a chemical reaction between the metal and silicon in the semiconductor structure 100. In some embodiments, a capping layer of each of the gates 401, 402, 506, 403 may be completely or partially removed before the formation of the silicide regions 613 to 620. Furthermore, the manufacturing of the semiconductor structure 100 may include one or more annealing processes for activating dopants in the semiconductor structure 100.

After the completion of the steps of the manufacturing process described above, the semiconductor structure 100 includes a logic transistor 626 which is provided at the logic transistor region 104. The logic transistor 626 includes, in particular, the gate 403 of the logic transistor, the channel region 616 below the gate 403, the source region 611, and the drain region 612.

Additionally, the semiconductor structure 100 includes a nonvolatile memory cell element 624 and a nonvolatile memory cell element 625 which are provided at the nonvolatile memory region 103. The nonvolatile memory cell element 624 includes, in particular, the source region 504, the channel region 614, the drain region 609, the floating gate 501, the select gate 401 and the erase gate 506. The nonvolatile memory cell element 625 includes, in particular, the source region 504, the channel region 615, the drain region 610, the floating gate 502, the select gate 402 and the erase gate 506, wherein the source region 504 and the erase gate 506 are common to the nonvolatile memory cell elements 624, 625.

As will be described in the following, the nonvolatile memory cell 1001 (see FIG. 10) may be formed on the basis of the nonvolatile memory cell element 624, and the nonvolatile memory cell 1002 (see FIG. 10) may be formed on the basis of the nonvolatile memory cell element 625. The formation of the nonvolatile memory cells 1001, 1002 may include, in particular, a formation of a respective control gate over each of the floating gates 501, 502.

Further referring to FIG. 6, a liner layer 621 and a layer 622 of an interlayer dielectric may be deposited over the semiconductor structure 100. Each of the liner layer 621 and the layer 622 of the interlayer dielectric may be an electrically insulating layer that includes an electrically insulating material. The liner layer 621 and the layer 622 of interlayer dielectric may be formed of different materials that may be etched selectively relative to each other, and the liner layer 621 may be formed of a material that may be etched selectively relative to a material of the sidewall spacers 601, 602, 603, 604. In some embodiments, the liner layer 621 may include silicon nitride, and the layer 622 of interlayer dielectric may include silicon dioxide. For forming the liner layer 621 and the layer 622 of interlayer dielectric, deposition techniques such as chemical vapor deposition and plasma-enhanced chemical vapor deposition may be used. After the deposition of the interlayer dielectric of the layer 622, a chemical mechanical polishing process may be performed for obtaining a substantially planar surface of the layer 622 of interlayer dielectric.

Thereafter, a mask 623 may be formed over the semiconductor structure 100. The mask 623 may be a photoresist mask, and it may be formed by means of techniques of photolithography. The mask 623 may cover the logic transistor region 104 and portions of the nonvolatile memory region 103, wherein the mask 623 does not cover portions of the nonvolatile memory cell elements 624, 625 between the erase gate 506 and the select gates 401, 402 at which control gates are to be formed over the floating gates 501, 502.

In some embodiments, the photolithography process used for forming the mask 623 may be performed with relaxed specifications concerning parameters of the photolithography process, such as an alignment accuracy. As will be detailed in the following, in etch processes that are used for the formation of the control gates, techniques of self-alignment may be employed, which may compensate for inaccuracies in the formation of the mask 623 to a certain extent. Furthermore, the control gates may have a relatively large extension in a wordline direction of the semiconductor structure 100 (perpendicular to the plane of drawing of FIGS. 1-10) so that an alignment of the mask 623 in the wordline direction need not be critical.

After the formation of the mask 623, an etch process, that is schematically illustrated by arrows 627 in FIG. 6, may be performed. The etch process 627 may be a dry etch process, for example, a reactive ion etch process, that is adapted for selectively removing the interlayer dielectric of the layer 622 relative to the material of the liner layer 621. In embodiments wherein the interlayer dielectric of the layer 622 includes silicon dioxide and the liner layer 621 includes silicon nitride, the etch process 627 may be adapted for selectively removing silicon dioxide relative to silicon nitride. Due to the selectivity of the etch process 627, the etching can substantially stop as soon as the liner layer 621 is exposed.

Figure 7:
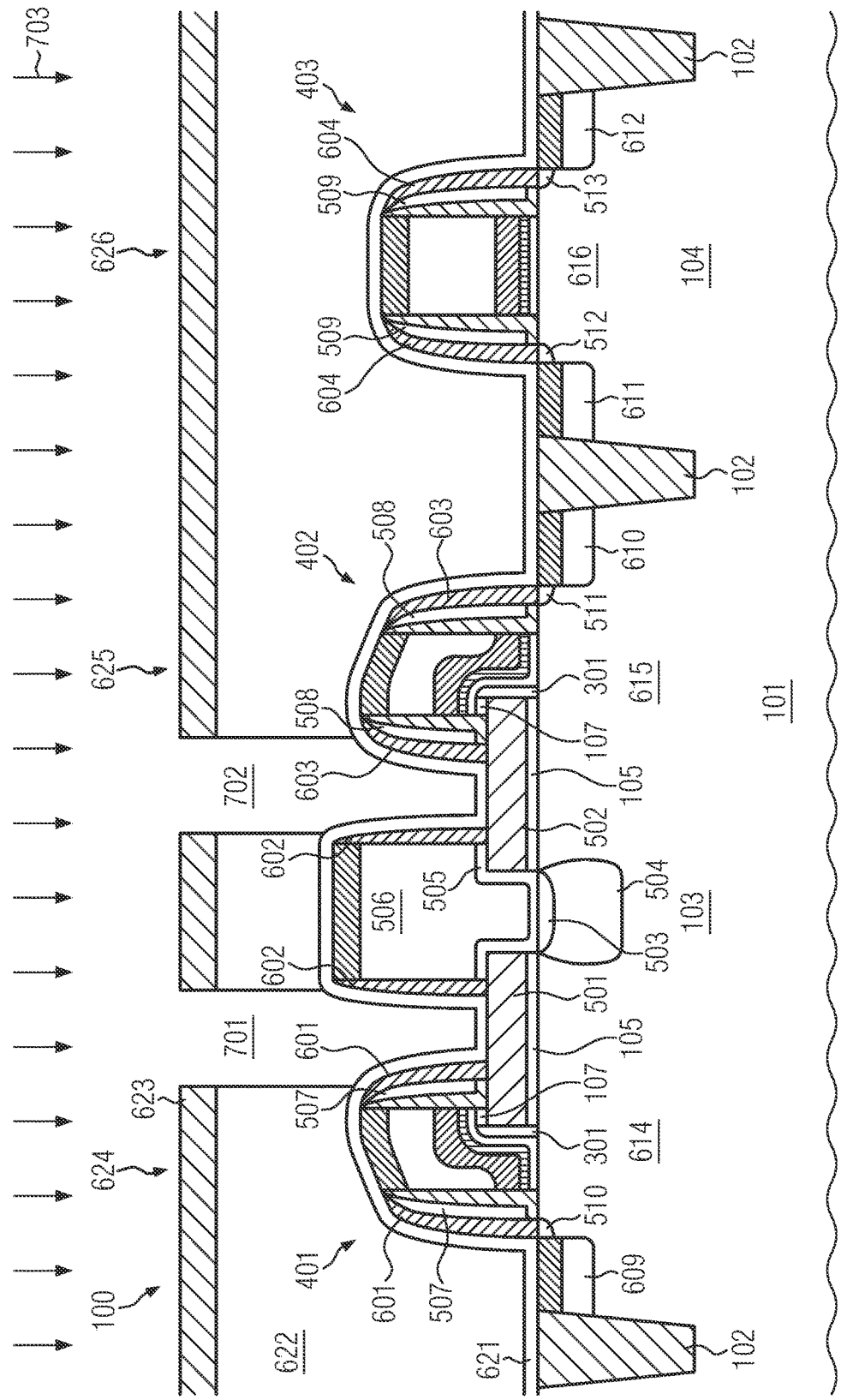

FIG. 7 shows a schematic cross-sectional view of the semiconductor structure 100 at a later stage of the manufacturing process. For clarity of illustration, in FIG. 7, some reference numerals of elements of the semiconductor structure 100 have been omitted. Unless explicitly indicated otherwise, features shown in FIG. 6 whose reference numerals have been omitted in FIG. 7, and which are shown in FIG. 7, may still be present in the semiconductor structure 100 at the stage of the manufacturing process illustrated in FIG. 7.

The removal of material of the layer 622 of interlayer dielectric by the etch process 627 creates an opening 701 in the layer 622 of interlayer dielectric over the floating gate 501 and an opening 702 in the layer 622 of interlayer dielectric over the floating gate 502. The openings 701, 702 may be trenches having a longitudinal direction that substantially extends in a wordline direction that is perpendicular to a channel length direction of the nonvolatile memory cell elements 624, 625 (perpendicular to the plane of drawing of FIGS. 1-10). The openings 701, 702 may extend across nonvolatile memory cell elements (not shown) other than the nonvolatile memory cells 624, 625 in the semiconductor structure 100. The openings 701, 702 may extend into the spaces between the erase gate 506 and the select gates 401, 402, wherein surfaces of the lower parts of the openings 701, 702 in the spaces between the erase gate 506 and the select gates 401, 402 are defined by an interface between the layer 622 of the interlayer dielectric and the liner layer 621. Thus, a self-alignment of the lower parts of the openings 701, 702 to the spaces between the erase gate 506 and the select gates 401, 402 may be obtained.

After the etch process 627, another etch process may be performed, which is schematically illustrated by arrows 703 in FIG. 7. The etch process 703 may be adapted for selectively removing a material of the liner layer 621 relative to a material of the sidewall spacers 601, 602, 603 at the erase gate 506 and the select gates 401, 402 and the interlayer dielectric of the layer 622. In embodiments wherein the liner layer 621 includes silicon nitride, the etch process 703 may be a reactive ion etch process adapted for the etching of silicon nitride. Reactive ion etch processes for the etching of silicon nitride providing a relatively high etch selectivity relative to silicon dioxide and photoresists are known.

Figure 8:
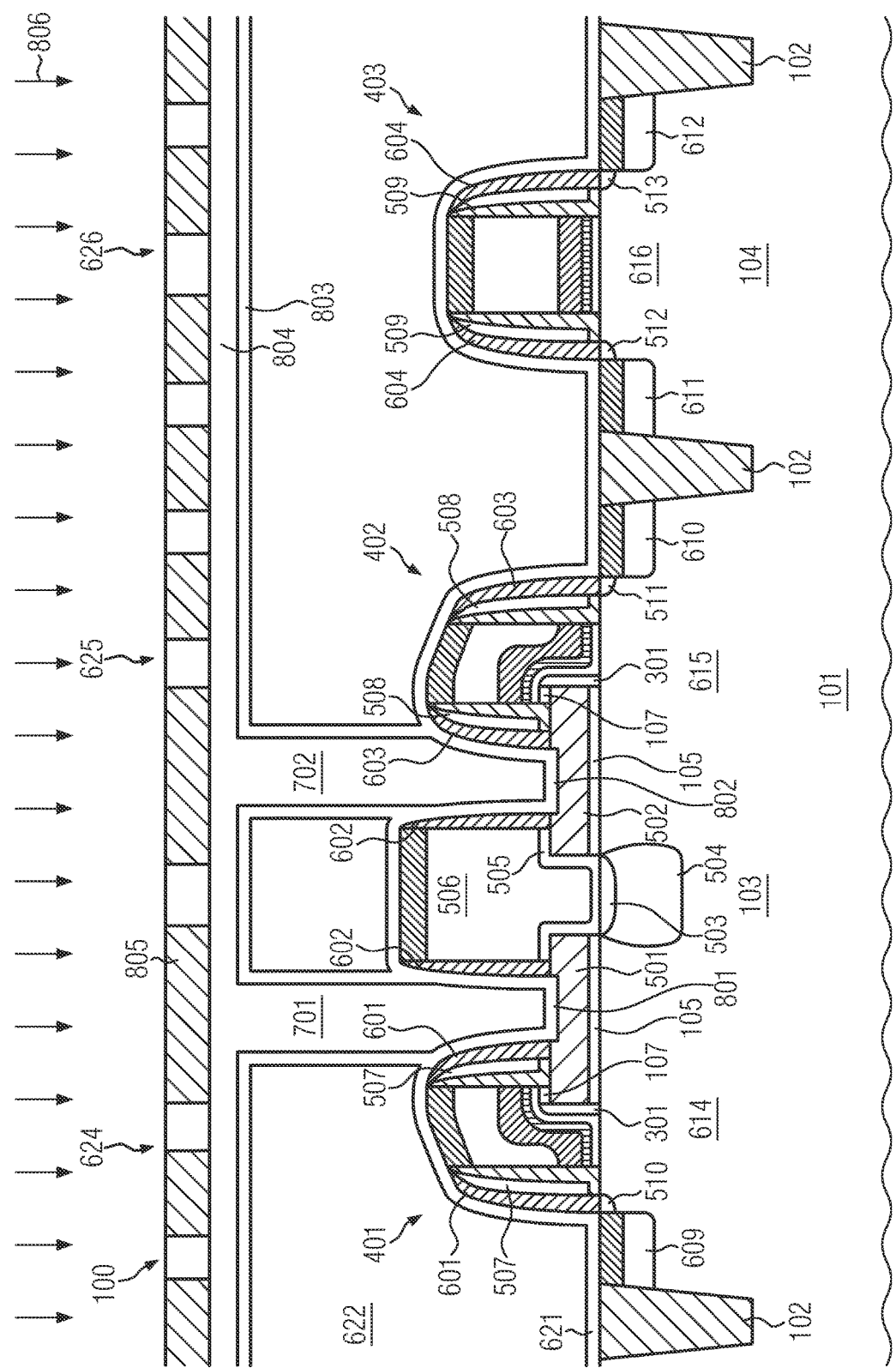

FIG. 8 shows a schematic cross-sectional view of the semiconductor structure 100 in a later stage of the manufacturing process. After the etch process 703, the floating gates 501, 502 may be exposed at the bottom of the openings 701, 702. Due to the selectivity of the etch processes 627, 703, the lower portions of the openings 701, 702 may be self-aligned to the erase gate 506 and the select gates 401, 402 so that the portions of the floating gates 501, 502 that are exposed at the bottom of the openings 701, 702 are self-aligned relative to the erase gate 506 and the select gates 401, 402.

In some embodiments, the etch process 703 may be adapted to remove a portion of the floating gate 501 and a portion of the floating gate 502 so that a recess 801 in the floating gate 501 is formed at the bottom of the opening 701, and a recess 802 in the floating gate 502 is formed at the bottom of the opening 702. The recesses 801, 802 may help to increase coupling ratios between the floating gates 501, 502 and the control gates that will be formed in the openings 701, 702 in later stages of the manufacturing process, as described below. In some embodiments, the etch process 703 may additionally provide a roughening of the surfaces of the floating gates 501, 502 that are exposed at the bottom of the openings 701, 702 and/or an additional roughening process may be performed. This may help to increase the capacities between the floating gates 501, 502 and the control gates.

After the etch process 703, the mask 623 may be removed by means of a resist strip process, and cleaning processes may be performed for removing residues of the etch processes 627, 703 and/or the resist strip process from the semiconductor structure 100.

Thereafter, a control gate insulation layer 803 may be deposited over the semiconductor structure 100. The control gate insulation layer 803 may include one or more electrically insulating materials. In some embodiments, the control gate insulation layer 803 may include a plurality of sublayers that are formed of different materials.

Figure 11:
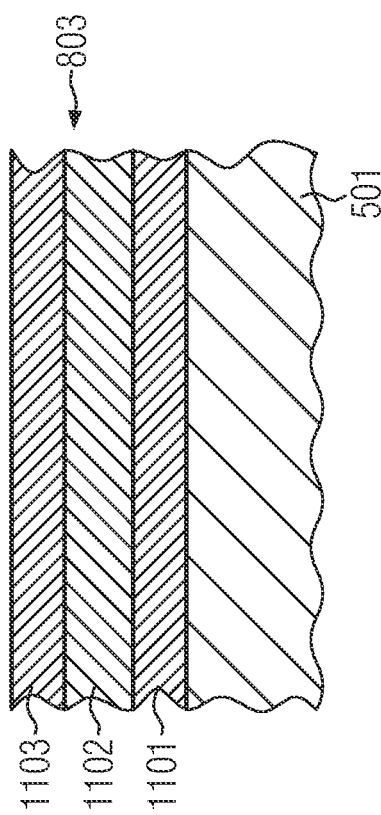
FIG. 11 shows a schematic cross-sectional view of a portion of the semiconductor structure illustrated in FIGS. 1-10 at a stage of the manufacturing process.

FIG. 11 shows a schematic cross-sectional view of a portion of the control gate insulation layer 803 at the bottom of the opening 701 after the deposition of the control gate insulation layer 803 in accordance with an embodiment. The control gate insulation layer 803 may include a first sublayer 1101 including silicon dioxide, a second sublayer 1102 including silicon nitride and a third sublayer 1103 including silicon dioxide. The first sublayer 1101 may be provided directly on portions of the semiconductor structure 100 below the control gate insulation layer 803. In particular, at the bottom of the opening 701, the first sublayer 1101 may be provided directly on the floating gate 501. Similarly, at the bottom of the opening 702, the first sublayer 1101 may be provided directly on the floating gate 502. The second sublayer 1102 may be provided on the first sublayer 1101, and the third sublayer 1103 may be provided on the second sublayer 1102 so that the second sublayer 1102 is arranged over the first sublayer 1101 and below the third sublayer 1103.

For forming the control gate insulation layer 803, the first sublayer 1101 may be deposited over the semiconductor structure 100. Then, the second sublayer 1102 may be deposited over the first sublayer 1101. Thereafter, the third sublayer 1103 may be deposited over the second sublayer 1102. The deposition of the sublayers 1101, 1102, 1103 may be performed by means of processes for the deposition of the materials of the sublayers 1101, 1102, 1103 such as chemical vapor deposition and/or plasma-enhanced chemical vapor deposition.

In embodiments wherein the first sublayer 1101 and the third sublayer 1103 include silicon dioxide and the second sublayer 1102 includes silicon nitride, the sublayers 1101, 1102, 1103 of the control gate insulation layer 803 may form an oxide-nitride-oxide (ONO) stack, which may provide a relatively good electrical insulation between the floating gates 501, 502 and the control gates formed over the floating gates 501, 502, as well as a relatively high dielectric constant, which may improve the coupling between the floating gates 501, 502 and the control gates.

In some embodiments, the deposition processes used for the deposition of the control gate insulation layer 803 may be substantially conformal deposition processes so that a thickness of portions of the control gate insulation layer 803 over substantially horizontal portions of the semiconductor structure 100 such as, for example, portions of the control gate insulation layer at the bottom of the openings 701, 702 on the floating gates 501, 502 is approximately equal to a thickness of portions of the control gate insulation layer 803 over inclined portions of the semiconductor structure 100 such as the sidewalls of the openings 701, 702. In other embodiments, anisotropic deposition processes may be employed for the formation of one or more of the sublayers 1101, 1102, 1103 of the control gate insulation layer 803 so that the control gate insulation layer 803 is thicker at the bottom of the openings 701, 702 than on the sidewalls of the openings 701, 702. This may help to improve the coupling between the floating gates 501, 502 and the control gates.

After the formation of the control gate insulation layer 803, a planarization layer 804 may be deposited over the semiconductor structure 100. The planarization layer 804 may include a carbon-based optical planarization layer (OPL) or a bottom anti-reflective coating (BARC), and it may be formed by means of techniques such as spin coating. The planarization layer 804 may fill the openings 701, 702, and it may provide a substantially planar surface of the semiconductor structure 100.

Thereafter, a mask 805 may be formed on the planarization layer 804. The mask 805 may be a photomask, and it may be formed by means of a photolithography process. The mask 805 may cover portions of the nonvolatile memory region 103 and the logic transistor region 104 with the exception of portions at which electrical contacts for providing electrical connections to the erase gate 506, the select gates 401, 402, the drain regions 609, 610, the source region 611, the drain region 612 and the gate 403 are to be formed.

Thereafter, one or more etch processes, that are schematically illustrated by arrows 806 in FIG. 8, may be performed. The one or more etch processes 806 may be adapted for removing the materials of the control gate insulation layer 803, the layer 622 of interlayer dielectric and the liner layer 621.

Figure 9:
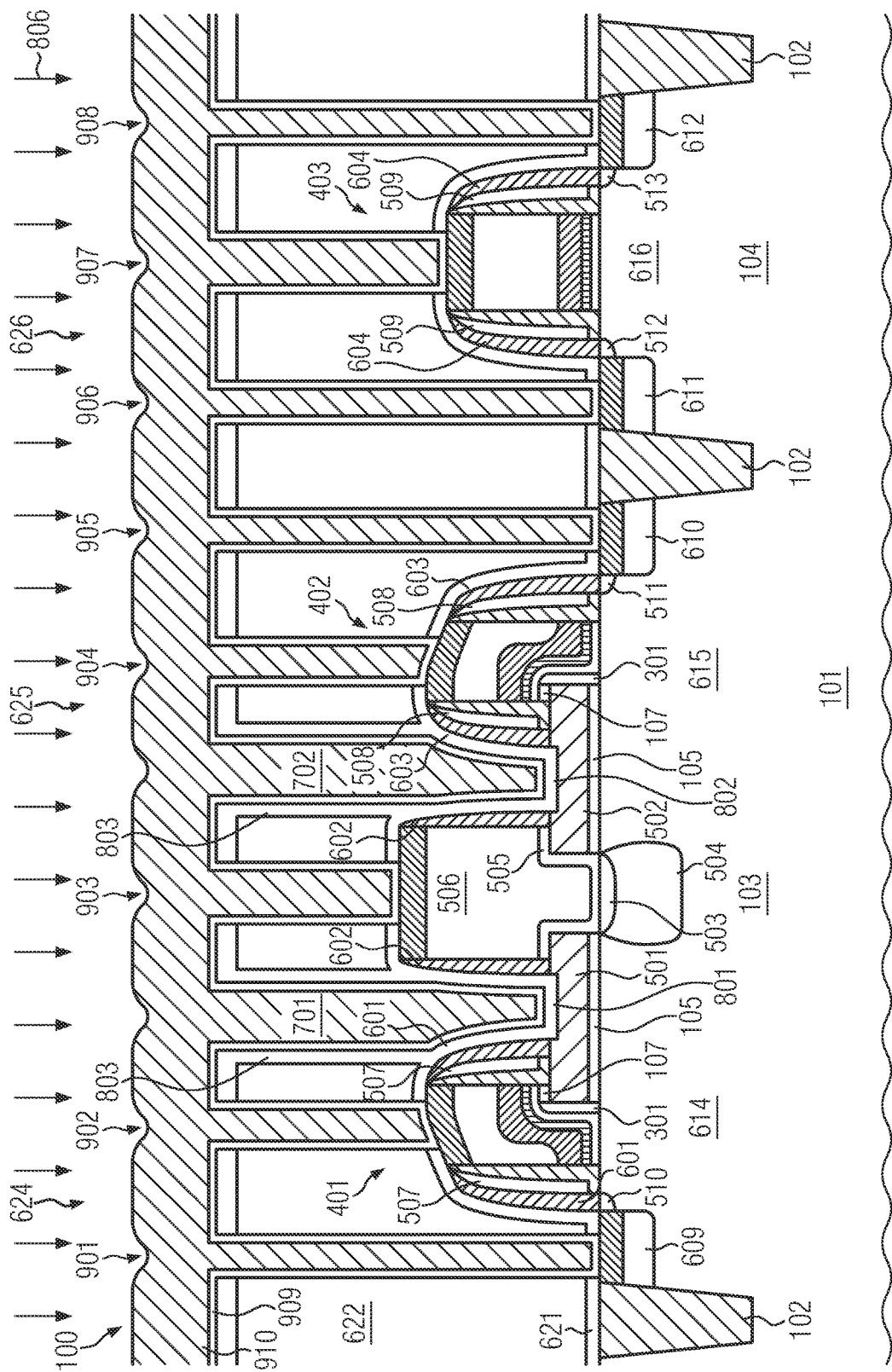

FIG. 9 shows a schematic cross-sectional view of the semiconductor structure 100 in a later stage of the manufacturing process. The one or more etch processes 806 may remove portions of the control gate insulation layer 803, the layer 622 of interlayer dielectric and the liner layer 621 which are not covered by the mask 805 so that openings 901 to 908 may be formed in the layer 622 of the interlayer dielectric and the liner layer 621. The openings 901, 905 may be provided over the drain region 609 and the drain region 610, respectively. The openings 902, 904 may be provided over the select gate 401 and the select gate 402, respectively. The opening 903 may be provided over the erase gate 506. The openings 906, 907, 908 may be provided over the source region 611, the gate 403 and the drain region 612 of the logic transistor 626. Different from the openings 701, 702 over the floating gates 501, 502, the openings 901 to 908 do not include portions of the control gate insulation layer 803, which is provided at the bottom and the sidewalls of the openings 701, 702. Features of the openings 901 to 908 may correspond to those of contact holes provided in semiconductor structures for making electrical connections to circuit elements. An extension of the openings 901 to 908 in the wordline direction (perpendicular to the plane of drawing of FIG. 9) may be approximately equal to an extension of the openings 901 to 908 in the channel length direction of the nonvolatile memory cell elements 624, 625 (horizontal in FIG. 9).

In some embodiments, after a last one of the one or more etch processes 806 that is used for removing portions of the liner layer 621 at the bottom of the openings 901 to 908, a resist strip process may be performed for removing the planarization layer 804 and the mask 805. In other embodiments, the resist strip process that is performed for removing the planarization layer 804 and the mask 805 may be performed after the etching of the layer 622 of the interlayer dielectric and before the removal of portions of the liner layer 621 at the bottom of the openings 901 to 908. In such embodiments, the removal of the portions of the liner layer 621 at the bottom of the openings 901 to 908 may be performed by means of a highly selective reactive ion etch chemistry adapted for removing the material of the liner layer 621 which may include silicon nitride, as described above, and leaving the material of the third sublayer 1103 of the control gate insulation layer 803, which may include silicon dioxide and is exposed at the surface of the semiconductor structure 100 after the removal of the planarization layer 804 and the mask 805, substantially unaffected.

In some embodiments, the resist strip process employed for the removal of the planarization layer 804 and the mask 805 may include a known resist strip process on the basis of oxygen ($O_2$) or hydrazine ($N_2H_2$). After the resist strip process, a cleaning process may be performed for removing residues of the one or more etch processes 806 and the resist strip process from the semiconductor structure 100. The resist strip process and a cleaning chemistry of the cleaning process may be adapted for avoiding an adverse influence on the material of the third sublayer 1103 of the control gate insulation layer 803.

Thereafter, an adhesion layer 909 may be deposited over the semiconductor structure 100. The adhesion layer 909 may include an electrically conductive material such as tantalum nitride and/or titanium nitride, and it may be formed by means of an atomic layer deposition process and/or a sputtering process. The adhesion layer 909 may be provided at a bottom surface and at a sidewall surface of each of the openings 701, 702 and 901 to 908. Portions of the adhesion layer 909 in the openings 701, 702 may be provided on the control gate insulation layer 803, wherein the control gate insulation layer 803 separates the adhesion layer 909 from other portions of the semiconductor structure 100, such as the floating gates 501, 502. Portions of the adhesion layer 909 in the openings 901 to 908 may contact the materials of the layer 622 of interlayer dielectric and the liner layer 621 as well as the silicide formed in the drain regions 609, 610, the select gates 401, 402 and the control gate 506 of the nonvolatile memory cell elements 624, 625 and the silicide in the source region 611, the gate 403 and the drain region 612 of the logic transistor 626.

After the formation of the adhesion layer 909, a layer 910 of an electrically conductive material may be deposited over the semiconductor structure 100. In some embodiments, the electrically conductive material of the layer 910 may include a metal, for example, tungsten. The adhesion layer 909 may improve an adhesion between the electrically conductive material of the layer 910 and materials of other portions of the semiconductor structure 100 such as, for example, the interlayer dielectric of the layer 622. For forming the layer 910 of the electrically conductive material, deposition techniques such as chemical vapor deposition corresponding to those used in known techniques for filling contact holes with an electrically conductive material may be used.

The electrically conductive material of the layer 910 may fill each of the openings 701, 702 and 901 to 908.

Figure 10:
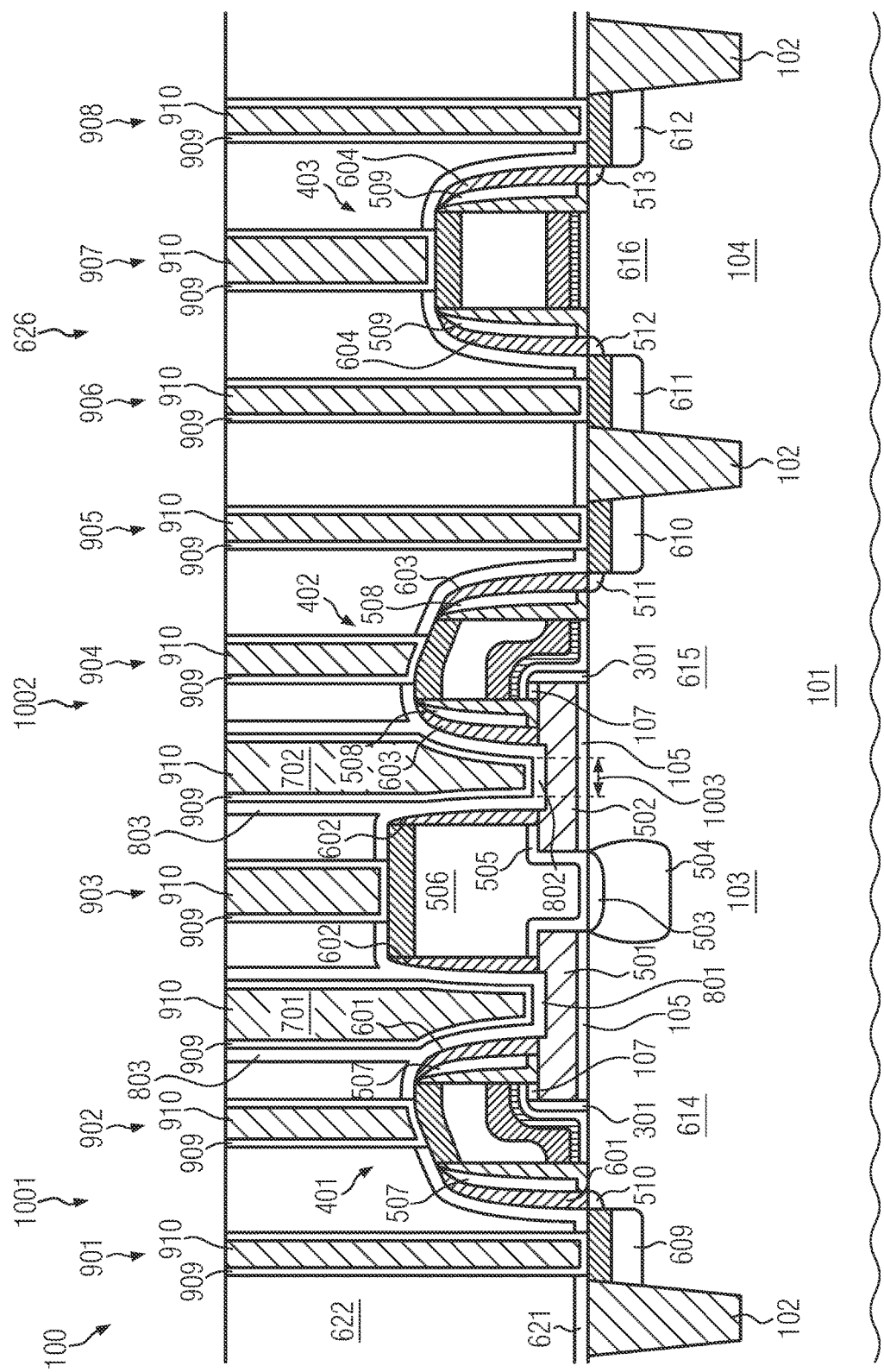

FIG. 10 shows a schematic cross-sectional view of the semiconductor structure 100 in a later stage of the manufacturing process. After the deposition of the layer 910 of electrically conductive material, a chemical mechanical polishing process may be performed. The chemical mechanical polishing process may remove portions of the control gate insulation layer 803, the adhesion layer 909 and the layer 910 of the electrically conductive material outside the openings 701, 702 and 901 to 908 so that the interlayer dielectric of the layer 622 is exposed at the surface of the semiconductor structure 100 and the portions of the control gate insulation layer 803, the adhesion layer 909 and the layer 910 of the electrically conductive material in the individual openings 701, 702 and 901 to 908 are separated from each other.

Portions of the layer 910 of the electrically conductive material in the openings 701, 702 over the floating gates 501, 502 form control gates. The portion of the layer 910 of the electrically conductive material in the opening 701 provides a control gate of a nonvolatile memory cell 1001 that is formed on the basis of the nonvolatile memory cell element 624, and the portion of the layer 910 of electrically conductive material in the opening 702 provides a control gate of a nonvolatile memory cell 1002 that is formed on the basis of the nonvolatile memory cell element 625.

In addition to the control gate provided by the portion of the electrically conductive material in the opening 701, the nonvolatile memory cell 1001 includes elements of the nonvolatile memory cell element 624, in particular the source region 504, the channel region 614, the drain region 609, the floating gate 501, the select gate 401 and the erase gate 506. The channel region 614 includes a portion below the floating gate 501 and a portion below the select gate 401 that is not covered by the floating gate 501.

In addition to the control gate provided by the portion of the electrically conductive material in the opening 702, the nonvolatile memory cell 1002 includes elements of the nonvolatile memory cell element 625, in particular the source region 504, the channel region 615, the drain region 610, the floating gate 502, the select gate 402 and the erase gate 506, wherein the source region 504 and the erase gate 506 are common to the nonvolatile memory cells 1001, 1002. The channel region 615 includes a portion below the floating gate 502 and a portion below the select gate 402 that is not covered by the floating gate 502.

The portion of the layer 910 of electrically conductive material in the opening 701 is separated and electrically insulated from the floating gate 501 by the portion of the control gate insulation layer 803 in the opening 701. The portion of the layer 910 of electrically conductive material in the opening 702 is separated and electrically insulated from the floating gate 502 by the portion of the control gate insulation layer 803 in the opening 702. Thus, the control gates of the nonvolatile memory cells 1001, 1002 are electrically insulated from the floating gates 501, 502. As shown in FIG. 10, the control gates of the nonvolatile memory cells 1001, 1002 extend through the liner layer 621 and the layer 622 of the interlayer dielectric.

The portion of the layer 910 of electrically conductive material in the opening 901 provides a drain contact to the drain region 609 of the nonvolatile memory cell 1001, and the portion of the layer 910 of electrically conductive material in the opening 905 provides a drain contact to the drain region 610 of the nonvolatile memory cell 1002. The drain contacts may be electrically connected to the drain region 609 and the drain region 610, respectively, since no electrically insulating materials are provided between the electrically conductive material in the openings 901, 905 and the silicide in the drain regions 609, 610. Similarly, the electrically conductive material in the opening 902 provides a select gate contact to the select gate 401 of the nonvolatile memory cell 1001, and the electrically conductive material in the opening 904 provides a select gate contact to the select gate 402 of the nonvolatile memory cell 1002. The electrically conductive material in the opening 903 provides an erase gate contact to the erase gate 506. The select gate contacts and the erase gate contact may be electrically connected to the respective gate.

The electrically conductive material in the openings 906, 907, 908 provides source, gate and drain contacts, respectively, to the source region 611, the gate 403 and the drain region 612 of the logic transistor 626.

Further features of the openings 901 to 908 filled with the electrically conductive material of the layer 910 may correspond to those of known contacts that are employed for providing electrical connections to circuit elements in semiconductor structures.

Extensions of the control gates of the nonvolatile memory cells 1001, 1002 in the channel length direction (horizontal in the view of FIG. 10) may correspond to distances between the sidewall spacer 602 at the erase gate 506 and the sidewall spacers 601, 603 at the select gates 401, 402, minus twice the thickness of the portions of the control gate insulation layer 803 at the sidewalls of the openings 701, 702. In FIG. 10, the extension of the control gate of the nonvolatile memory cell 1002 in the channel length direction is denoted by reference numeral 1003. The extension 1003 may have a value in a range from about 30-170 nm, for example, about 120 nm. A spacing between the control gates and the select gates 401, 402 may be provided by a combined thickness of the sidewall spacers 507, 601, and a combined thickness of the sidewall spacers 508, 603, respectively, and may have a value of about 25 nm. A spacing between the control gates and the erase gate 506 may be provided by a thickness of the sidewall spacer 602, and it may be about 15 nm.

After performing the steps of the manufacturing process described above, back-end-of-line manufacturing processes may be performed, wherein interconnect layers providing electrical connections to the control gates of the nonvolatile memory cells 1001, 1002 and to the electrical contacts provided by the openings 901 to 908 filled with the electrically conductive material are formed. Since the control gates of the nonvolatile memory cells 1001, 1002 extend through the layer 622 of the interlayer dielectric, the control gates may be directly connected to electrically conductive elements in the interconnect layer over the layer 622 of interlayer dielectric.

Technology Computer Aided Design (TCAD) simulations performed by the inventors have shown that control gates of nonvolatile memory cells as described above may provide coupling ratios that are sufficient for an operation of the nonvolatile memory cells.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
providing a semiconductor structure comprising a nonvolatile memory cell element and one or more electrically insulating layers covering said nonvolatile memory cell element, said nonvolatile memory cell element comprising a source region, a channel region, a drain region and a floating gate over at least a first portion of said channel region;
forming a first opening in said one or more electrically insulating layers over said floating gate;
after the formation of said first opening, depositing a control gate insulation layer;
after the deposition of said control gate insulation layer, forming a second opening in said one or more electrically insulating layers over said drain region; and
filling said first opening and said second opening with an electrically conductive material, wherein said electrically conductive material in said first opening provides a control gate of said nonvolatile memory cell element and said electrically conductive material in said second opening provides an electrical contact to said drain region.

2. The method of claim 1, wherein said nonvolatile memory cell element further comprises a select gate, wherein at least a portion of said select gate is provided over a second portion of said channel region, wherein said first portion of said channel region is adjacent said source region, wherein said second portion of said channel region is between said first portion of said channel region and said drain region, wherein said floating gate is provided over said first portion of said channel region but not over said second portion of said channel region, and wherein the method further comprises:
after the deposition of said control gate insulation layer, forming a third opening in said one or more electrically insulating layers over said select gate and filling said third opening with said electrically conductive material, wherein said electrically conductive material in said third opening provides an electrical contact to said select gate.

3. The method of claim 2, wherein said nonvolatile memory cell element further comprises an erase gate provided over said source region, and wherein the method further comprises:

after the deposition of said control gate insulation layer, forming a fourth opening in said one or more electrically insulating layers over said erase gate and filling said fourth opening with said electrically conductive material, wherein said electrically conductive material in said fourth opening provides an electrical contact to said erase gate.

4. The method of claim 3, wherein said filling of said first opening, said second opening, said third opening and said fourth opening with said electrically conductive material comprises depositing a layer of said electrically conductive material over said semiconductor structure and performing a polishing process wherein portions of said electrically conductive material outside said first opening, said second opening, said third opening and said fourth opening are removed.

5. The method of claim 4, wherein said one or more electrically insulating layers comprise a liner layer over said nonvolatile memory cell and a layer of an interlayer dielectric over said liner layer, and wherein the formation of said first opening comprises:

forming a first mask over said semiconductor structure;
performing a first etch process, said first etch process selectively removing a material of said interlayer dielectric relative to a material of said first mask and a material of said liner layer;
after said first etch process, performing a second etch process, said second etch process selectively removing said material of said liner layer relative to said material of said mask and said material of said interlayer dielectric; and
removing said first mask.

6. The method of claim 5, wherein said second etch process additionally removes a portion of said floating gate wherein at least one of a formation of a recess in said floating gate and a roughening of a surface of said floating gate are obtained.

7. The method of claim 6, wherein said nonvolatile memory cell further comprises a first sidewall spacer at a sidewall of said select gate and a second sidewall spacer at a sidewall of said erase gate, and wherein said second etch process selectively removes said material of said liner layer relative to a material of said first sidewall spacer and a material of said second sidewall spacer.

8. The method of claim 7, wherein the deposition of said control gate insulation layer comprises:

depositing a first sublayer of said control gate insulation layer comprising silicon dioxide;
depositing a second sublayer of said control gate insulation layer comprising silicon nitride over said first sublayer of said control gate insulation layer; and
depositing a third sublayer of said control gate insulation layer comprising silicon dioxide over said second sublayer of said control gate insulation layer.

9. The method of claim 8, wherein the formation of said second opening, said third opening and said fourth opening comprises:

forming a planarization layer over said semiconductor structure, said planarization layer filling said first opening and providing a planarization of said semiconductor structure;
forming a second mask over said planarization layer;
performing one or more etch processes adapted to remove materials of said control gate insulation layer, said layer of interlayer dielectric and said liner layer; and
removing said second mask and said planarization layer.

10. The method of claim 9, wherein said electrically conductive material comprises tungsten.

11. The method of claim 10, further comprising, before the deposition of said layer of said electrically conductive material, performing at least one of an atomic layer deposition process and a sputtering process, said at least one of said atomic layer deposition process and said sputter process depositing an adhesion layer comprising at least one of titanium nitride and tantalum nitride over said semiconductor structure.

* * * * *